US011774537B2

(12) United States Patent
Holce et al.

(10) Patent No.: US 11,774,537 B2
(45) Date of Patent: Oct. 3, 2023

(54) PRE-SETTABLE CURRENT SENSING APPARATUS, SYSTEM, AND/OR METHOD

(71) Applicant: Senva, Inc., Beaverton, OR (US)

(72) Inventors: Kent Jeffrey Holce, Portland, OR (US); Rodrick Eren Seely, Tigard, OR (US); William Forrest Hudson

(73) Assignee: Senva, Inc., Beaverton, OR (US)

( * ) Notice: Subject to any disclaimer, the term of this patent is extended or adjusted under 35 U.S.C. 154(b) by 0 days.

(21) Appl. No.: 14/217,229

(22) Filed: Mar. 17, 2014

(65) Prior Publication Data
US 2014/0375304 A1 Dec. 25, 2014

Related U.S. Application Data

(63) Continuation-in-part of application No. 12/705,560, filed on Feb. 12, 2010, now abandoned, which is a continuation-in-part of application No. 12/351,803, filed on Jan. 9, 2009, now abandoned, application No. 14/217,229 is a continuation-in-part of application No. 12/351,803, filed on Jan. 9, 2009, now abandoned.

(Continued)

(51) Int. Cl.
| G01R 35/00 | (2006.01) |
| G01R 31/34 | (2020.01) |
| G01R 19/00 | (2006.01) |
| F24F 140/50 | (2018.01) |
| F24F 11/52 | (2018.01) |

(52) U.S. Cl.
CPC ......... *G01R 35/005* (2013.01); *G01R 31/343* (2013.01); *F24F 11/52* (2018.01); *F24F 2140/50* (2018.01); *G01R 19/0092* (2013.01)

(58) Field of Classification Search
CPC .... G01R 15/181; G01R 15/142; G01R 15/18; G01R 15/16; G01R 19/0092; G01R 15/186; G01R 19/22; G01R 1/0416; G01R 1/22; G01R 33/02; G01R 31/025; G01R 31/343; G01R 35/005; H02M 3/33507; H02M 1/32; H02M 3/156; H02M 2001/0009; H02M 3/33515
See application file for complete search history.

(56) References Cited

U.S. PATENT DOCUMENTS

| 4,262,191 A * | 4/1981 | Lepper .................... F24F 6/025 |
| | | 219/497 |
| 7,697,250 B2 * | 4/2010 | Davison ................. H01H 71/74 |
| | | 361/42 |

(Continued)

*Primary Examiner* — Alesa Allgood
(74) *Attorney, Agent, or Firm* — Northwest IP Law Group, LLC

(57) ABSTRACT

The present invention relates to electromechanical device status monitoring and equipment protection applications for industrial automation, HVAC, and other implementations; and, more particularly, to the use of current sensing devices to detect loss-of-flow conditions. Presently described embodiments can comprise simplified, compact current sensing devices that can be economical to build, inventory, distribute, and purchase. Present embodiments can easily be calibrated and/or set by hand prior to installation, and they can be configured for automatically offering proof-of-flow detection based, at least in part, on the initially provided setting.

16 Claims, 17 Drawing Sheets

Related U.S. Application Data

(60) Provisional application No. 61/802,269, filed on Mar. 15, 2013, provisional application No. 61/151,503, filed on Feb. 10, 2009, provisional application No. 61/010,471, filed on Jan. 9, 2008.

(56) References Cited

U.S. PATENT DOCUMENTS

| | | | |
|---|---|---|---|
| 2005/0177329 A1* | 8/2005 | Smith | G01P 21/00 702/66 |
| 2009/0315568 A1* | 12/2009 | Holce | G01R 31/343 324/555 |
| 2010/0321032 A1* | 12/2010 | Holce | G01R 31/343 324/601 |

* cited by examiner

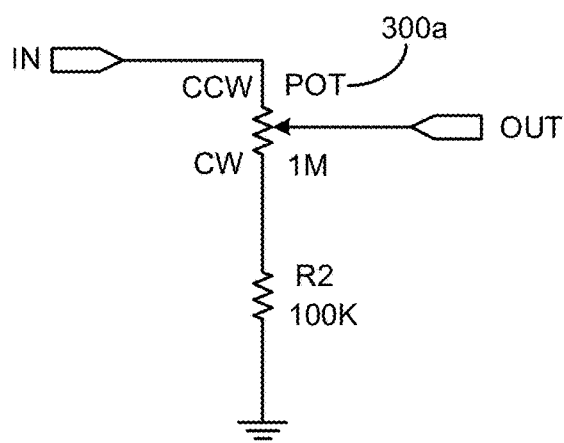
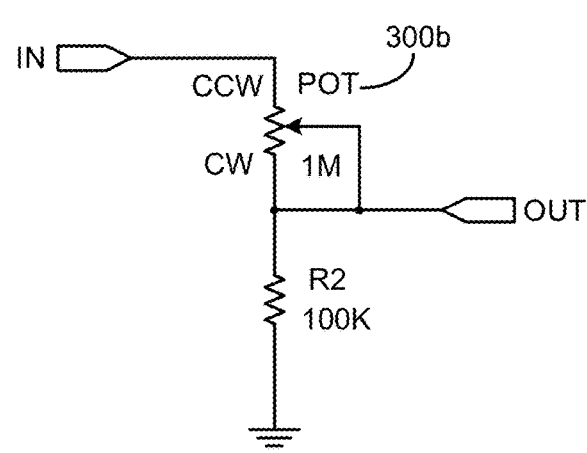
FIG. 3A (PRIOR ART)
FIG. 3B

PRE-SETTABLE CURRENT SENSING APPARATUS, SYSTEM, AND/OR METHOD

RELATED APPLICATIONS

This application is a nonprovisional of, and claims the benefit of priority from, U.S. Provisional Patent Application No. 61/802,269, filed Mar. 15, 2013; this application is a continuation-in-part of, and claims the benefit of priority from, U.S. Nonprovisional patent application Ser. No. 12/705,560, filed Feb. 12, 2010, which in turn is a nonprovisional of, and claims the benefit of priority from, U.S. Provisional Patent Application No. 61/151,503, filed Feb. 10, 2009, and which, along with this application, is a continuation-in-part of, and claims the benefit of priority from U.S. Nonprovisional patent application Ser. No. 12/351,803, filed Jan. 9, 2009, which in turn is a nonprovisional of, and claims the benefit of priority from, U.S. Provisional Patent Application No. 61/010,471, filed Jan. 9, 2008, each of which is hereby incorporated by reference in its entirety.

COPYRIGHT NOTICE

© 2013 Senva, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR § 1.71(d), (e).

TECHNICAL FIELD

The present application is directed to the field of monitoring, control, and protection of equipment in industrial automation systems, heating, ventilation, and air conditioning (HVAC) systems, and related implementations and/or applications; and, more particularly, to the use of current sensors for detecting and/or signaling proof of flow, loss of flow, load loss, and/or other conditions.

BACKGROUND

In industrial systems, motors, fans, pumps, and other electromechanical devices typically operate using an alternating current (AC) electrical power source that has a constant frequency, such as 50 or 60 hertz. In an industrial air conditioning system, or other heating, ventilation, and air conditioning (HVAC) system, as but one example, a motor can be coupled with a belt in order to drive a fan for purposes of circulating air through building ductwork. In order to facilitate remote detection of problems in the operation of the motor, belt, and/or fan (such as a broken belt, etc.), prior systems have employed one or more pressure transducers mounted in the ductwork to sense the air pressure values. If problems occur, such as the motor stopping, the belt breaking, or the fan breaking or jamming, the sensed air pressure in the ductwork typically exhibits a measurable pressure decrease. Pressure transducers sense such a decrease in the air pressure and can trigger an alarm signal. In a similar manner, tachometers can be used to monitor shaft rotations, belt travel distance, etc. for purposes of assessing operating status of motors connected to conveyor systems.

Unfortunately, pressure transducers and tachometers need to be installed using a time-consuming and error-prone process involving manual adjustment to set the desired threshold used to indicate that an alarm condition has been detected. Also, because pressure transducers are typically not solid state, but rather include moving parts, they are susceptible to accumulating dust and dirt that can diminish their performance and reliability over time. They often require additional labor in the form of ongoing maintenance, which adds to their operating costs. Furthermore, the cost of pressure transducers can be too expensive for many applications and they often require external power for operating, which can limit the locations and/or applications in which they can be used.

An alternative approach employs current sensors to sense current levels in a conducting cable supplying power to a motor or other device being monitored. The sensed current can provide information about the status of the motor or equipment, such as belts, fans, etc., connected to the system. If a connected belt breaks, as but one example of a system failure or alarm condition, the sensed current level typically exhibits a substantially significant drop in amperage. A properly calibrated current sensor device can be used to detect the current decrease and indicate an alarm condition and/or generate an appropriate output and/or control signal.

In a traditional monitoring system employing a current sensor, a current transformer can be installed to sense alternating current within a conducting wire, such as a power cable supplying operating power to a motor. As previously mentioned, other electrical and/or electromechanical devices, such as pumps, fans, conveyors, etc. may also be monitored, consistent with the principles of the present application, instead of or in addition to a motor device. A typical inductive current transformer can be a wire wrapped toroidal core surrounding the power cable. The toroidal core can be an iron core or an air core (a non-magnetically permeable material), as but two examples. On installation, the current sensor is configured or positioned so that the current conductor passes through the transformer core, and the core magnifies the conductor's magnetic field. An AC current source has a potential that is constantly changing between positive and negative values, generally at a set rate, such as 50 or 60 Hz. The expanding and collapsing magnetic field induces a current in the secondary windings around the core. The current transformer generates an output voltage signal at its terminals in the secondary winding that is proportional to or otherwise indicative of the current sensed in the power cable. This induced secondary current can be converted to a voltage and conditioned to provide a desired output and/or control signal.

To sense current in a specific system, a current sensor must first be installed and calibrated or otherwise set for its intended application. A traditional current sensor set-up procedure includes installing the current sensor unit, and then starting the motor so that current is running through the current sensor. Then, the installer/operator would have to reach inside the energized electrical panel with a small screwdriver, such as a jewelers screwdriver, and calibrate the current sensor by adjusting a multi-turn potentiometer (hereinafter "pot"), such as a "20-turn" or "30-turn" pot, as but two examples. The multi-turn potentiometer is turned multiple times in one direction until over/under LEDs toggle on or off in some particular manner. For traditional, commercially available current sensors, the manufacturer typically specifies a procedure for setting the current sensor once it is installed and energized. Unfortunately, the specified procedure is typically imprecise, confusing, and/or complex.

A multi-turn pot is typically referred to as a "20-turn pot," etc. because it is internally geared for a given number of turns. It practice, setting it can require 4, 10, 20, or some other number of turns, etc; but it typically requires multiple turns because the set points for such sensors typically exhibit non-linear characteristics (e.g., exponential or logarithmic scaling, etc.). For illustration, with a traditional current sensor, if one were to try to use a 1-turn pot having a 300-degree span of rotation, approximately the first half of the rotational range (e.g., 150 degrees) would represent only approximately one quarter of the scaled range, whereas the remaining three quarters of the scaled range would be crammed around the other 150 degrees of rotation.

The non-linearity of traditional current sensors results in inconvenient scaling that makes using single-turn pots unworkable and instead necessitates the use of multi-turn pots for calibration. By way of further illustration, the 8 o'clock position of a pot might be the setting for a 1 Amp trip point, for example. The 12 o'clock position might represent a 3 Amp trip point. However, rotation to the 2 o'clock or 3 o'clock position might represent a 30 Amp trip point, while the trip points from 50 to 135 Amps might be bunched up near the end of the pot's rotational range. As a result, with a traditional current sensor, it can be next to impossible to dial in a particular desired current using a single-turn pot. The gearing of a multi-turn pots helps spread out the range of set points over the multiple available rotations of the pot.

As previously mentioned, traditional current sensors are first installed, and then calibrated upon starting the motor (and/or other equipment) that is being monitored. Once the current sensor is energized, a screwdriver is used to rotate a tiny sensor adjustment screw until the sensor visually indicates that it is at its detection threshold. The LED indicators that are typically provided give some visual feedback as to whether the threshold has been set above or below the actual current being monitored; but there is no way to dial the current sensor directly to a desired current value. This procedure only sets the current sensor to the running current for the motor. However, for proof of flow applications, as one example, an installer would have to estimate setting adjustments. As a typical example, an installer would be required to use a tiny screwdriver to turn a multi-turn potentiometer multiple times it until an LED changes illumination state. Then the installer would have to turn the pot back in the other direction some imprecise amount, such as a quarter or half turn, etc. With existing current sensors, this procedure has been accepted as necessary because the normal run current may not be known by the installer and, even if the run current were known, there is no scaling dial on the adjustment screw to correlate the position-value of the sensor detection threshold setting to the known motor run current. It would also be impractical to have any such scale on a conventional sensor because the adjustment screw regularly requires multiple turns, due to the non-linear characteristics of the current sensing circuitry.

Unfortunately, in addition to being inconvenient, the traditional methodology for calibrating previous current sensors is also expensive and dangerous. Installers are required to install current sensors in all desired locations, start-up the motor and energize the system, and then return to each install site to calibrate each current sensor. The installer is also placing his or her hand (holding a screwdriver) in an energized enclosure, which presents a dangerous situation, running the risk of arc flash or electrocution. Also, existing current sensor embodiments would require someone in the field to conduct a calculation or otherwise make some approximation to discount the fully loaded motor current amperage by some selected amount if loss-of-flow detection is desired. Such setup procedures are imprecise, error prone, and can have inconsistent results.

More recently, microprocessor-based current sensor devices have been used for proof of flow detection, as an improvement developed, at least in part, to overcome the complexity and frustration of using a 30-turn, etc. pot. However, microprocessors are power-hungry, expensive, and, because they lack a very low turn-on point for power, they do not work in all applications (e.g., with Amperage levels less than around 2A—which does not provide sufficient power for operating the microprocessor). Also, they can often prove to be inflexible and unaccommodating of adjustments and/or customizations for atypical applications.

SUMMARY

Embodiments consistent with the present application offer substantial improvements over traditional current sensors, current sensor switches, and/or other current sensing devices that are commercially available for use in proof-of-flow applications. As disclosed herein, an improved current sensor embodiment can be provided that employs a circuit design and/or components that enable, at least in part, substantially linear scaling for calibration and/or setup. By using linear scaling, a one-turn potentiometer (hereinafter "pot") can be employed for convenient calibration prior to installing and/or energizing the current sensor. Embodiments consistent with the present application can also include a manual adjustment control coupled to the one-turn pot, allowing for the pot to be adjusted by hand (in addition to, or in lieu of using a screwdriver or other adjustment tool). Current sensor embodiments can employ a dial, knob, or other manual control to facilitate initial calibration, or for subsequent adjustment to accommodate system configuration and/or equipment changes, if necessary. A visual calibration scale can also be provisioned conveniently proximate to, and/or situated to work in cooperation with, the adjustment control so as to enable the installer to pre-set the sensor by directly dialing it to a chosen value represented on the scale. This calibration can be performed prior to installing the current sensing device, which eliminates the need to perform calibration inside an energized motor starter, or return to the install location for calibration after the system in energized.

To further facilitate installation and/or simplify the calibration procedure for proof-of-flow applications, embodiments as disclosed herein benefit from improved electronic calibration circuitry and/or circuit design elements that automatically establish an appropriate, corresponding trip point once a set point has been set manually. In one illustrative embodiment, the trip point preferably can be established as a set percentage below the set point manually selected by the installer. Such embodiments can use a pre-selected percentage that can be, at least in part, substantially representative of an expected current decrease in response to the occurrence of one or more conditions that can result in a loss of flow. As a set point, embodiments can use a value that is substantially convenient for an installer to ascertain. One such embodiment can allow an installer to set the current sensor to an easily ascertainable value such as the full load amperage ("FLA") of a motor and/or other device being monitored, which can be readily determined from a nameplate on the motor/device, from system plans, and/or from another convenient source, such as from an overload protection device that may be installed on the system. Based, at least in part, on the FLA setting indicated, such a current sensor embodiment can automatically establish and/or employ a trip point at a current value that is a predefined percentage less than the installer-indicated FLA. Such an embodiment can be automatically configured and/or appropriately set for detecting proof of flow, given the specified FLA value.

To provide additional flexibility and/or convenience, current sensor embodiments consistent with the present subject matter can, in one additional and/or alternative aspect, be designed employing a housing that can substantially accommodate the addition and/or removal of components such as control relays from a convenient location and/or configuration, such as the face of the current sensor unit, as but one example. The housing of present current sensing device embodiments can also be constructed so as to have an integrated or removable mounting base that facilitates DIN rail mounting of the device.

Embodiments employing individual or combinations of the previously described aspects and/or improvements can offer simplified, compact current sensor devices that can be economical to build, inventory, distribute, and purchase, and can offer functionality such as proof-of-flow detection in a variety of potential system configurations, each of which can exhibit potentially different current levels and/or operating characteristics. Additionally, present embodiments can offer substantially increased safety benefits for the installer, facilitate a simplified calibration procedure, and result in decreased labor costs for installation, replacement, and/or adjustment of current sensing devices embodying the present subject matter.

Additional aspects and advantages of this invention will be apparent from the following detailed description of preferred embodiments, which proceeds with reference to the accompanying drawings.

BRIEF DESCRIPTION OF THE DRAWINGS

FIG. 3A depicts a partial schematic of calibration circuit components representative of traditional current sensors.

FIG. 3B depicts a partial schematic of calibration circuit components consistent with an embodiment of the present subject matter.

DETAILED DESCRIPTION OF PREFERRED EMBODIMENTS

The following detailed description references apparatuses, systems, and methods embodying one or more principles of the invention consistent with the present application's subject matter. It should be appreciated, however, that the following embodiments are disclosed for illustrative purposes. They are meant to facilitate discussion, not serve as a limitation on the claimed subject matter. As such, the various components, structures, configurations, operating ranges, and/or other aspects of the disclosed embodiments are not meant to indicate limitations on the present invention. Those skilled in the relevant art will appreciate that the disclosed embodiments can be modified with fewer, additional, and/or alternative elements without departing from the scope of the present invention.

In the fields of industrial automation, heating, ventilation, and air conditioning, (HVAC), and other automated control systems and/or related applications, current sensing devices often are employed to trigger a set of contacts or to provide an analog or digital output signal and/or control signal based on sensed current. Such devices can be particularly useful in many motor control and/or monitoring applications.

Figure 1:
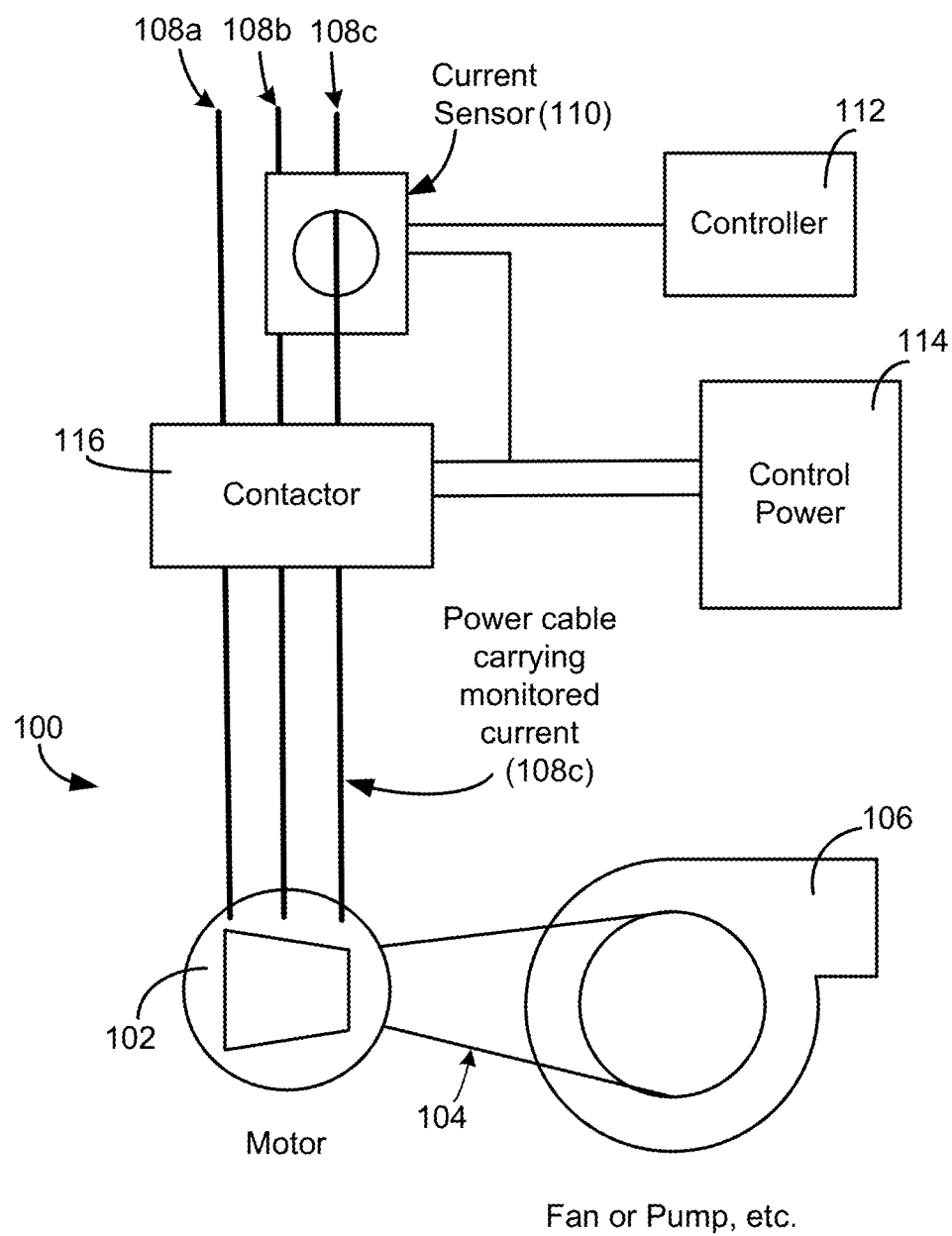
FIG. 1 illustrates one embodiment of a system configuration consistent with the present subject matter.

FIG. 1 illustrates an example of a high-level schematic of an industrial control system employing a current sensor. With particular reference to FIG. 1, the system 100 includes a motor 102 coupled by a belt 104 to a fan 106 in order to drive air through a building, etc. Motor 102 is powered by power cables 108a-108c. A current sensor 110 can be installed to monitor current through one of the power cables 108c. If switching or control functionality is desired, current sensor 110 can be provided as a current sensing switch and/or similar device. Current sensor 110 accordingly can be coupled to and/or in communication with a system controller 112, and, if an appropriate condition is detected, it can signal for control power 114 to be cut via a relay, such as contactor 116.

Figure 2A:
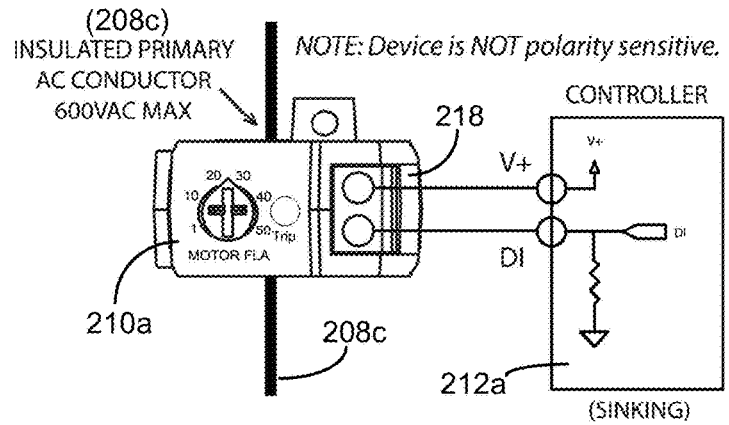
FIGS. 2A and 2B illustrate alternative embodiments of wiring diagrams coupling a current sensor with a controller, consistent with the present subject matter.
Figure 2B:
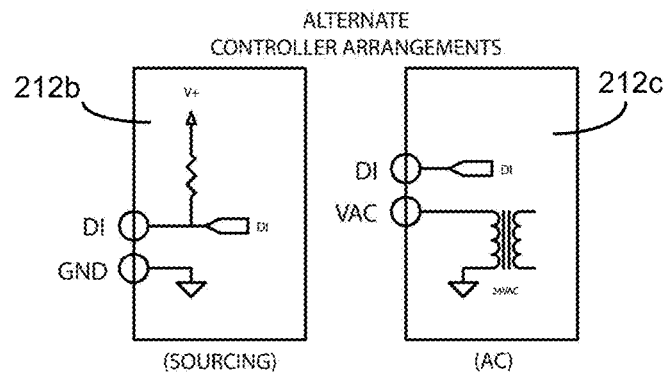
Figure 2B:
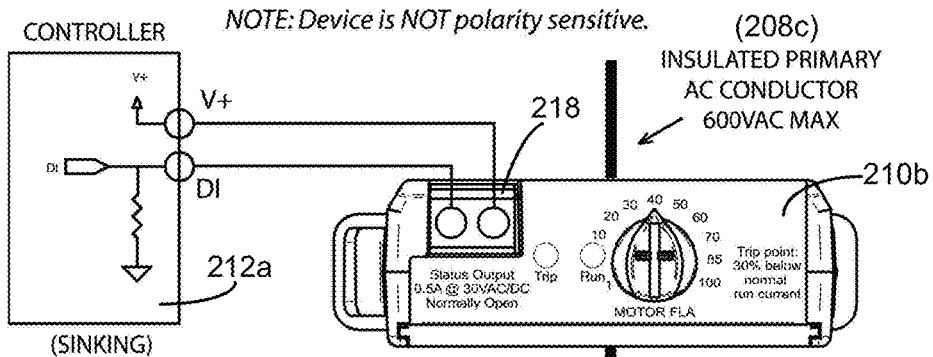
Figure 2B:
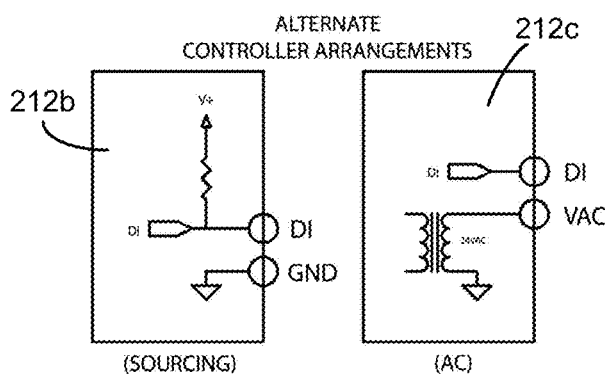
Figure 4:
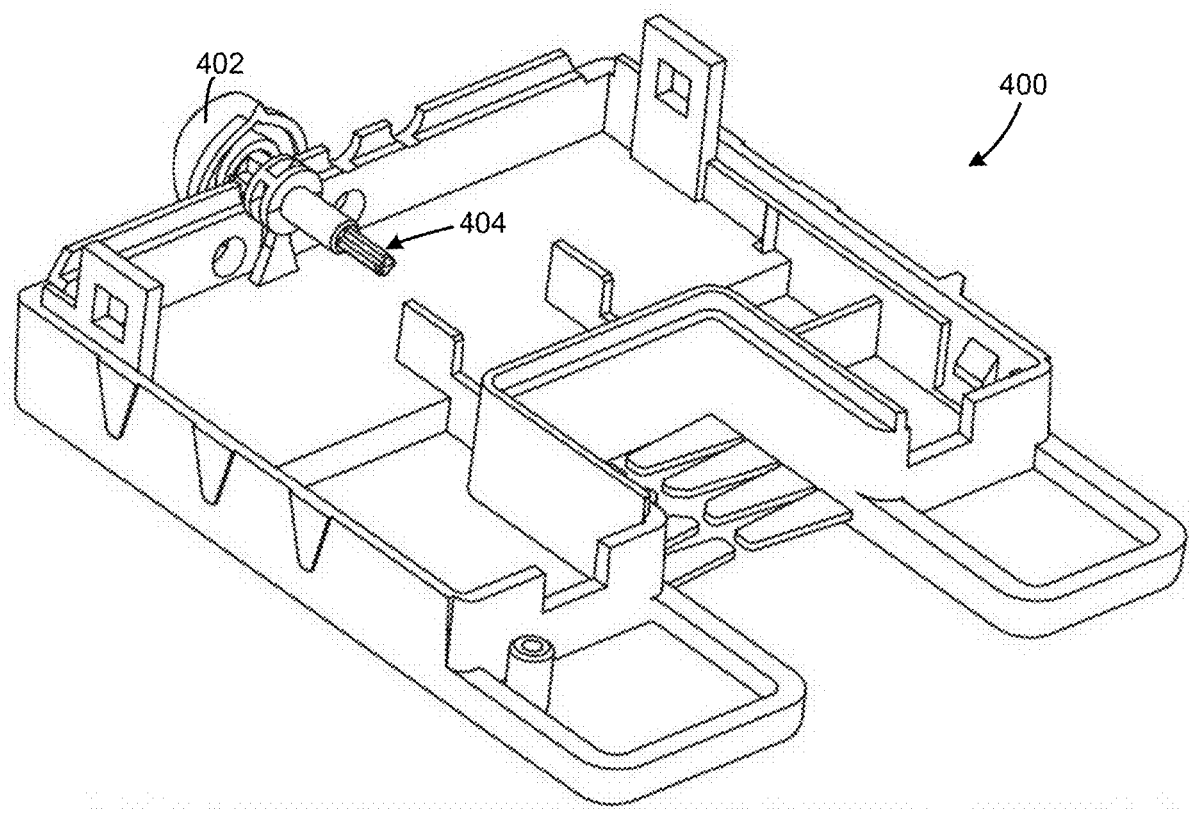
FIGS. 4-10 depict various individual component and partial assembly views of one embodiment of a current sensor design consistent with the present subject matter.
Figure 5:
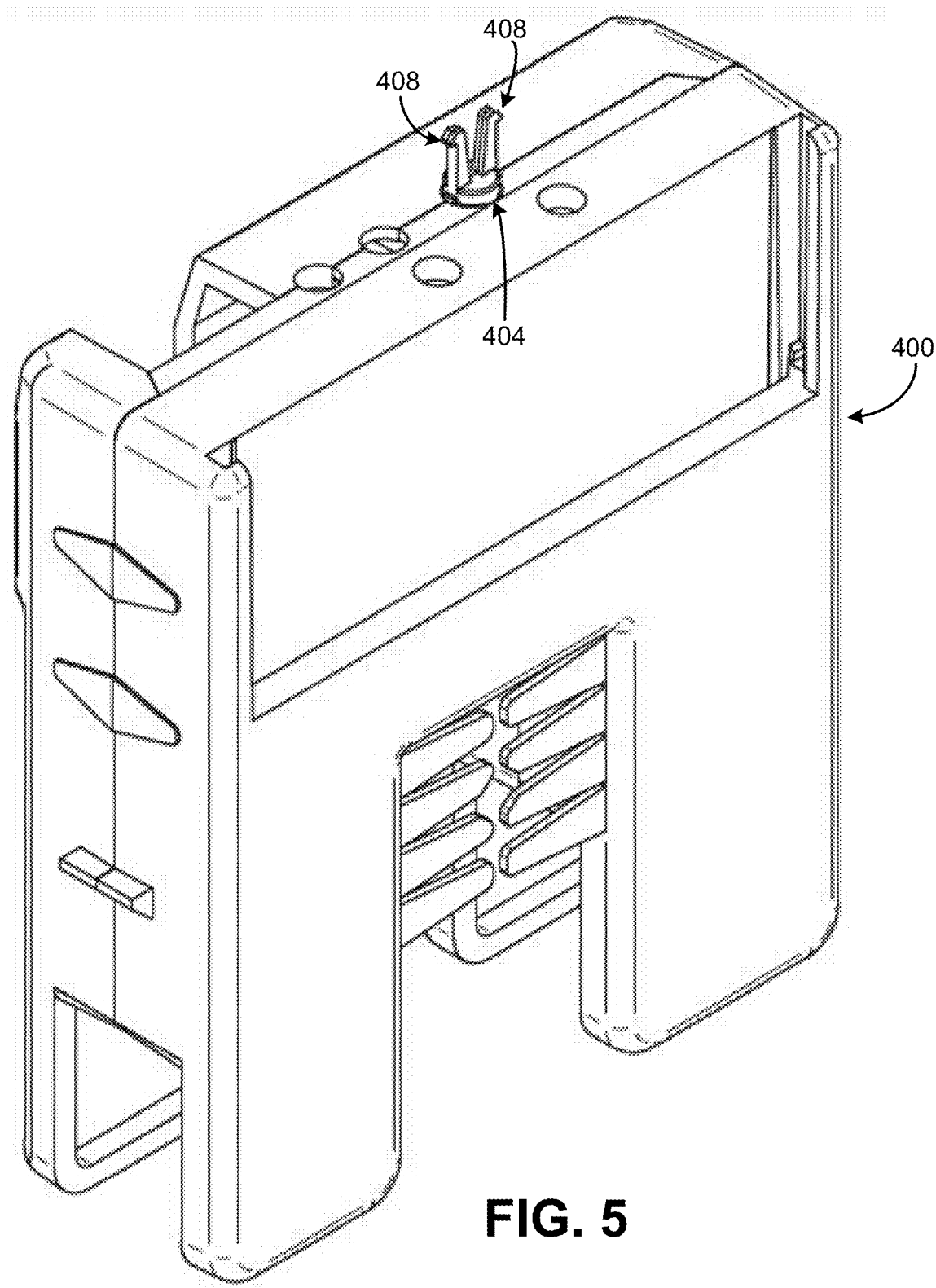
Figure 6:
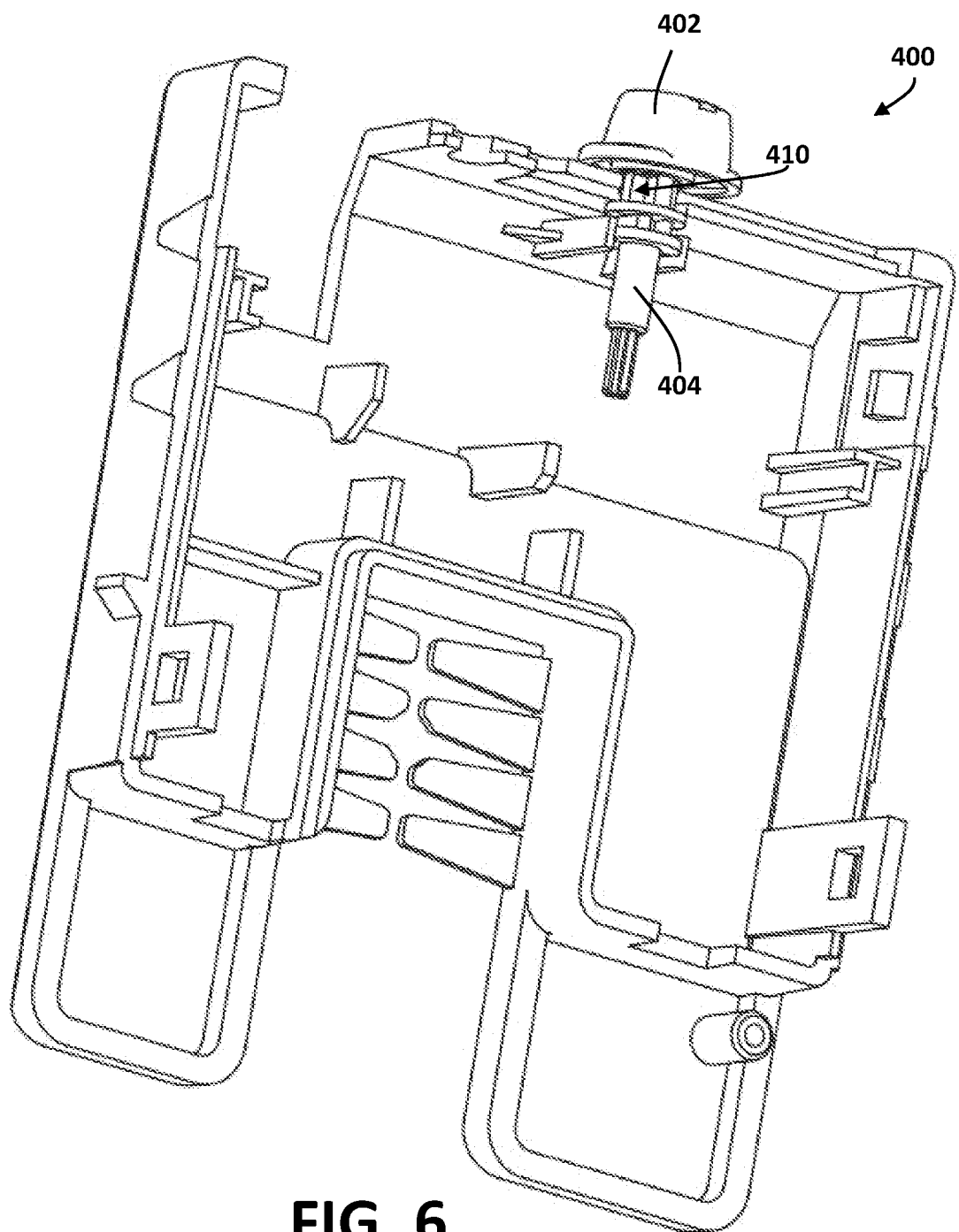
Figure 7:
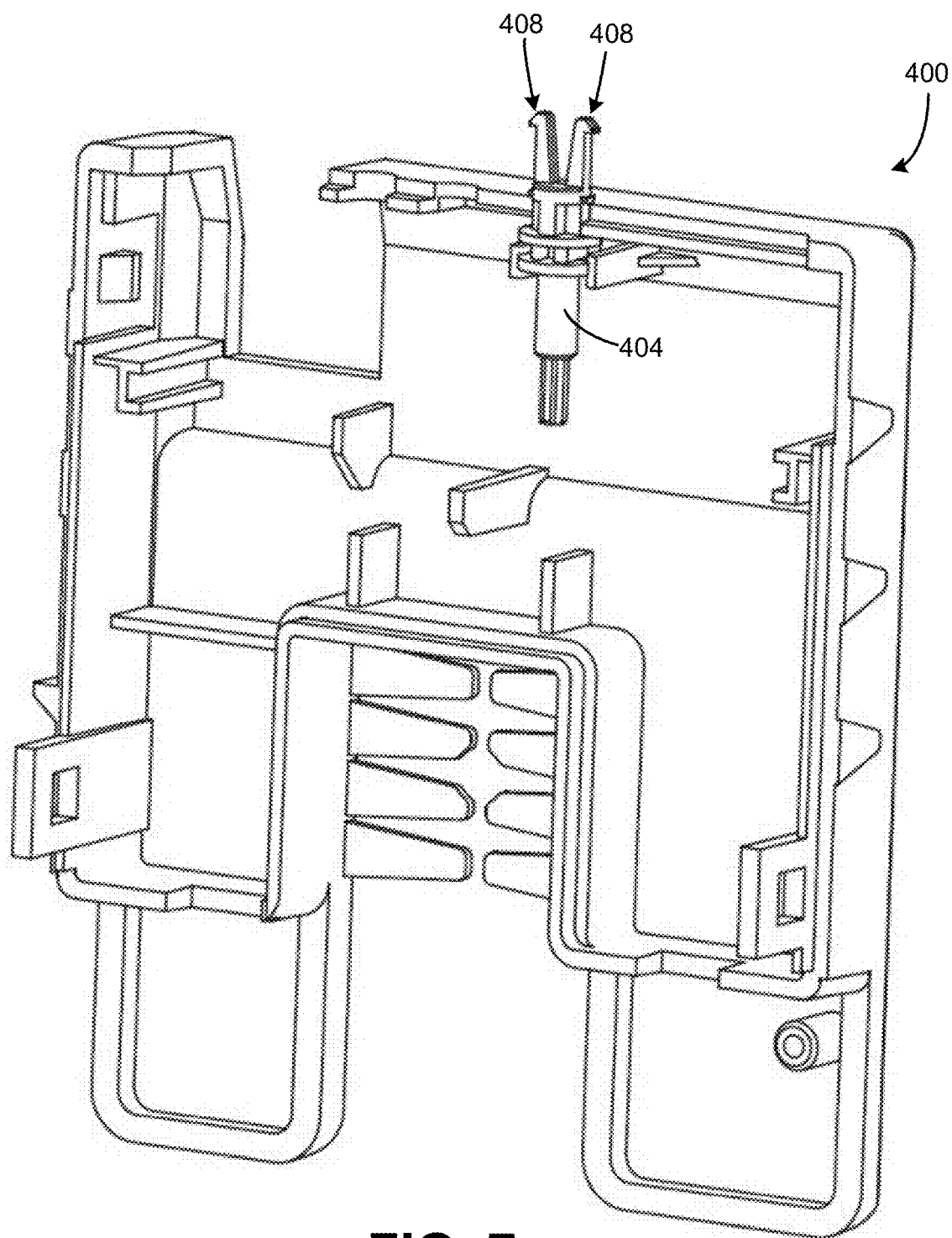
Figure 8:
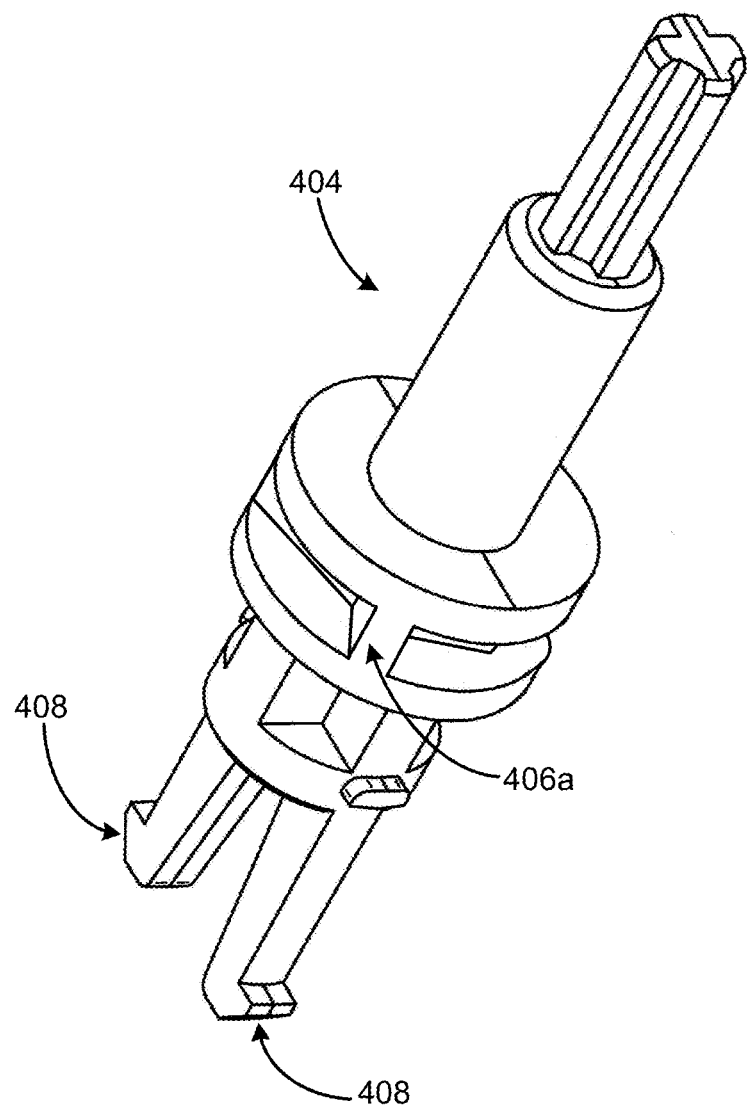
Figure 9:
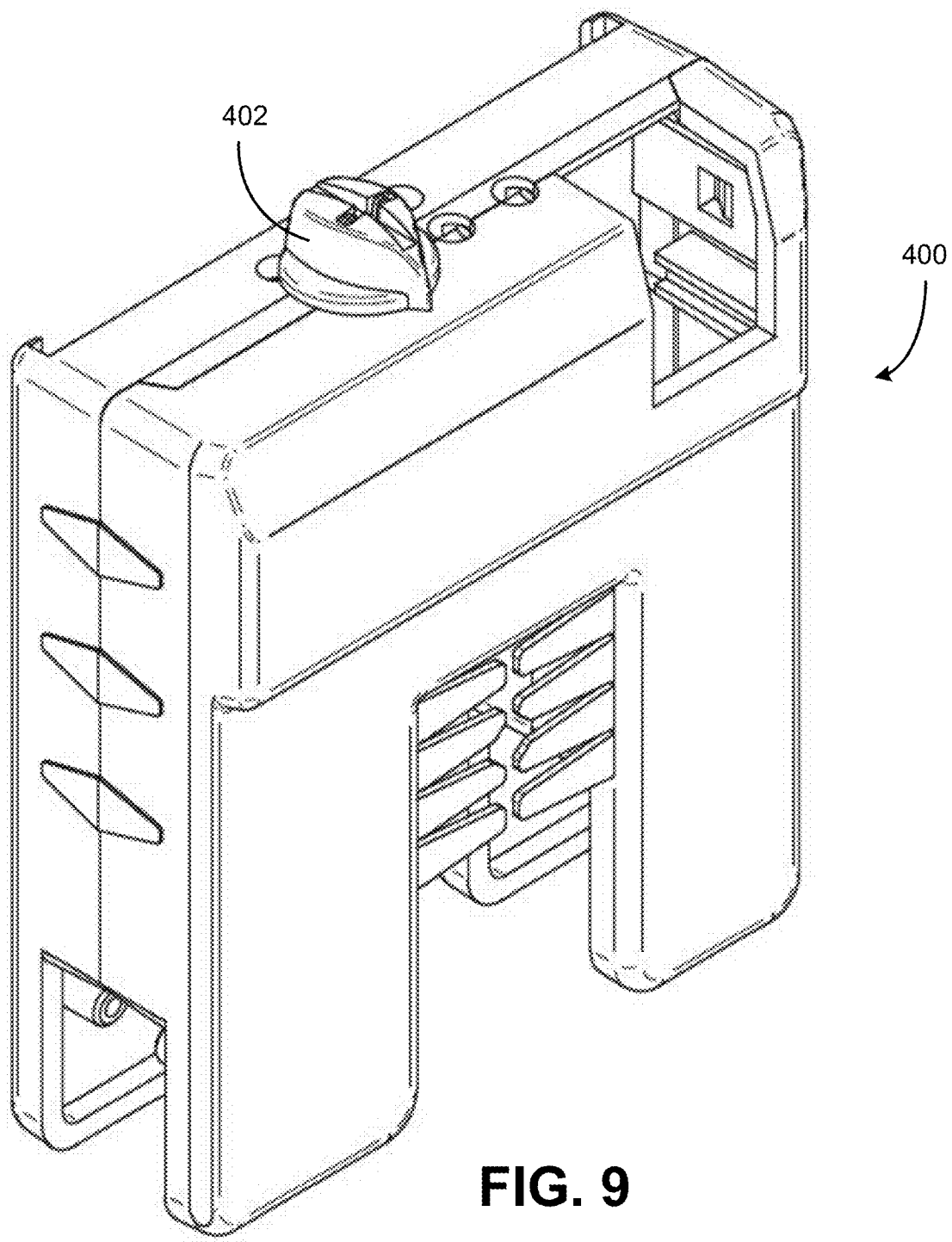
Figure 10:
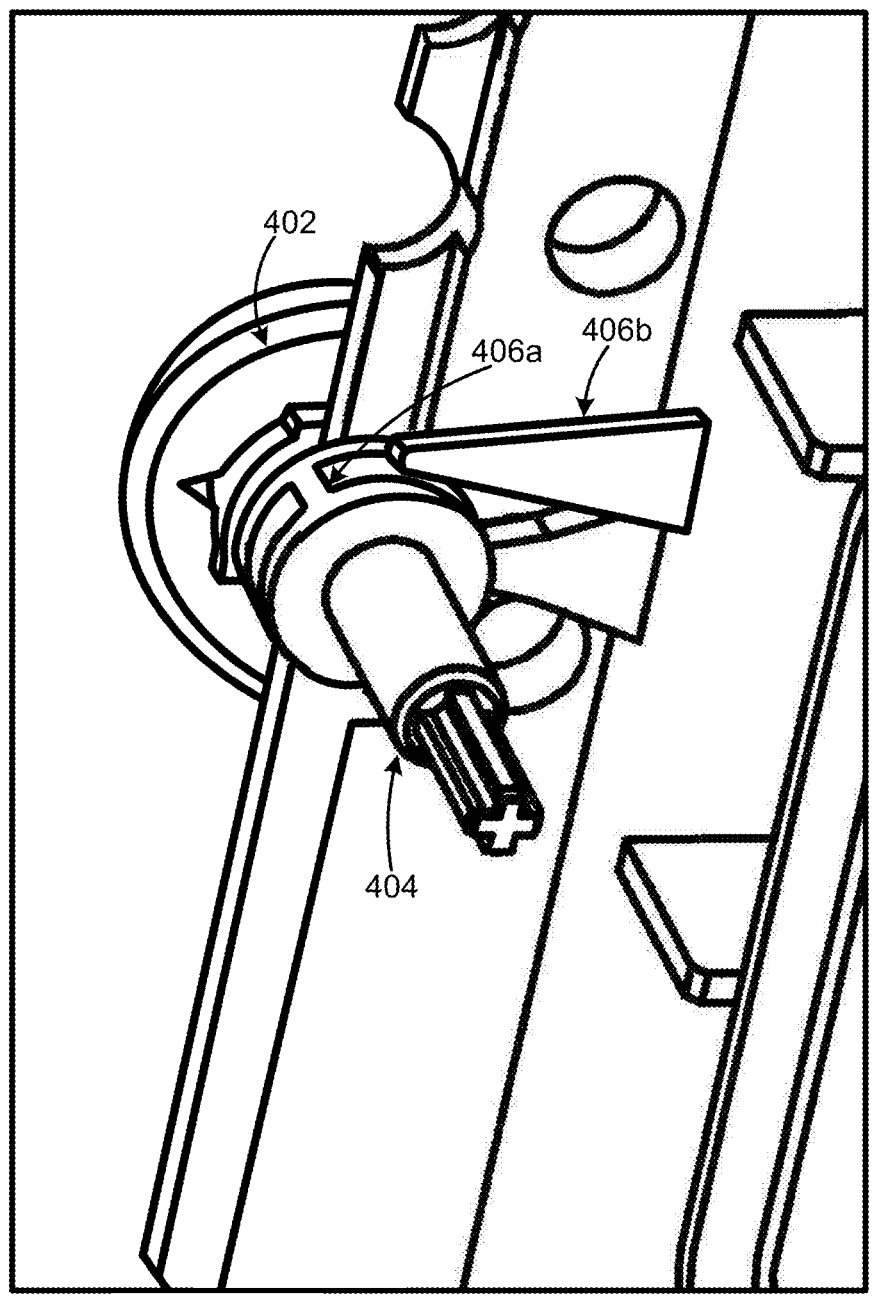
Figure 11A:
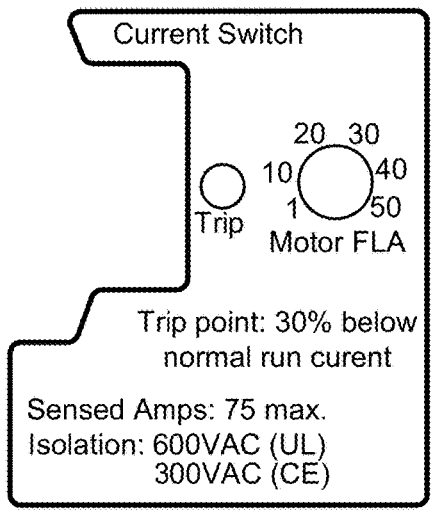
FIGS. 11A-11D illustrate alternative embodiments of scaled current sensor labels consistent with the present subject matter.
Figure 11B:
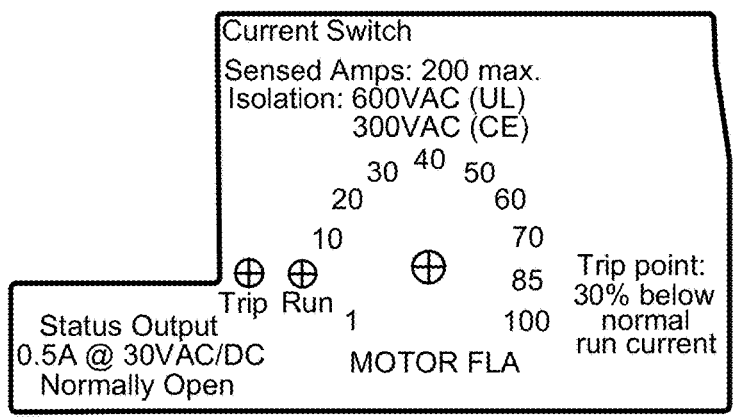
Figure 11C:
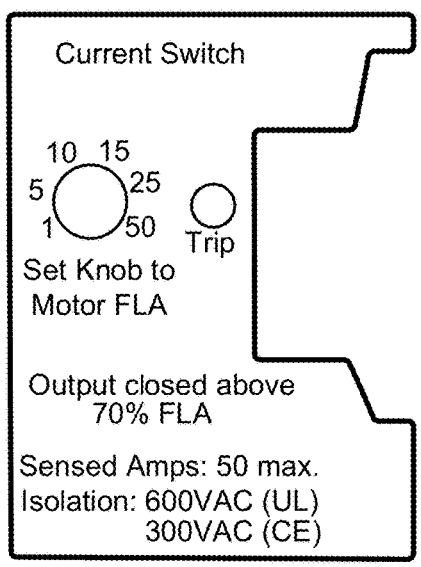
Figure 11D:
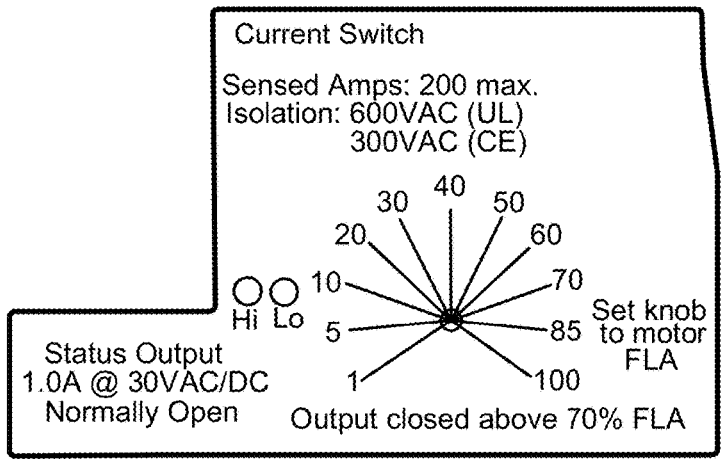

FIGS. 2A and 2B show wiring diagrams to provide additional illustrative depictions of example connections between a controller and a current sensing device, depicted as current sensor switch 210a in FIG. 2A and current sensor switch 210b in FIG. 2B. In FIGS. 2A and 2B, current sensor switches 210a, 210b are illustrated as being installed to monitor current in primary conductor 208c. Each current sensor switch 210a, 210b is also coupled to a controller 212a. However, those skilled in the art will appreciate that the wiring configuration connecting current sensor switches 210a, 201b to controller 212a is not the only possible configuration. Depending on system parameters and desired functionality, modified configurations can be employed. For example, alternative controller arrangements 212b, 212c are also depicted, for illustrative purposes, and are equally within the scope of the present subject matter.

Devices such as current sensor switches 210a, 210b of FIGS. 2A and 2B, respectively, can prove particularly useful in applications for monitoring and/or controlling motors and other electromechanical devices. As disclosed herein, embodiments can employ an improved circuitry design and/or components to comprise improved current sensor devices that can have, among other benefits, substantially simplified calibration procedures for initial installation and/or subsequent adjustment. For example, one such embodiment of a current sensing device can include a potentiometer (hereinafter "pot") wired into a calibration circuitry so as to be configured to offer substantially linearly adjustable resistance values distributed substantially evenly over the range of motion of the pot adjustment mechanism. As used herein, the terms "linearized" and/or "linear" are used to indicate a relationship whereby substantially the same amount of resistance adjustment and/or corresponding change in output signal can be achieved for a given number of degrees of rotation of a rotationally adjusted pot adjustment mechanism (or straight adjustment of a slider pot, etc.). Such embodiments can help spread the scale of settings out substantially evenly around and/or across the adjustment range.

FIG. 3B depicts a partial current sensor schematic illustrating a relevant portion of one embodiment of linear calibration circuitry and/or circuit components. The employed novel configuration in the calibration circuitry corresponding to the pot wiring provides significant improvements over the traditional non-linear designs typical of past current sensors (which, for comparison purposes, are represented by the illustrative corresponding partial circuit schematic in FIG. 3A). The remainder of the circuit diagrams of FIGS. 3A and 3B are substantially identical and generally representative of commercially available current sensors, so, for clarity, such details have been omitted from the illustration and the present discussion.

The manner in which pot 300b of FIG. 3B is configured in the circuitry can provide significant benefits, at least in part, by taking advantage of the linear characteristics achieved. One example of such a benefit is the ability to employ a 1-turn pot, which represents a significant improvement over the inconvenient 20- or 30-turn pots typical required in prior art devices.

Also, the achieved substantially linear characteristic in the calibration circuitry can, at least in part, beneficially enable present embodiments to provision a calibration scale (or scaled range of current values, etc.) visually on a device. However, it is worth noting that, in one or more such embodiments, the incremental spacing of the values displayed on the scale may not be exactly linear (e.g., the magnitude of the current values between gradations or settings on the scale may not be exactly equal, etc.). This is mostly due to non-linearity in the magnetic characteristics of the circuit and/or second order non-linear effects of non-ideal electronic components. However, such embodiments enjoy scaling that is sufficiently linear to allow for the convenient printing of numbers, visible to an installer, on a scale substantially in a circle around, or otherwise conveniently proximate to, an adjustment control of the pot (assuming the pot is rotationally adjusted—although other pot embodiments, such as a slider pot could also be used and appropriately include scaled values in a substantially straight line configuration corresponding to the range of pot movement). Using embodiments of a calibration scale, an installer can adjust the pot (and thus set the current sensor) directly to a desired, displayed value, or adjust it to a position approximately corresponding to a desired value linearly interpolated between two displayed values on the scale.

An embodiment can employ novel design aspects that can, at least in part, offer a substantially improved and simplified experience for installers, mechanics, etc. One such embodiment can provide a pre-assembled, integrated, coupled, and/or otherwise conveniently provisioned manual adjustment control for setting or adjusting the pot. As one illustrative type of control, one adjustment control can be embodied as a knob configured, at least in part, to be gripped and turned by hand (so that an installer, etc. does not have to use a screwdriver for setting/adjusting the pot). Other manual controls, such as dials, sliders, switches, buttons, etc. can also be used consistent with the present subject matter. One or more embodiments offering an adjustment control, such as a knob, in combination with a calibration scale, can enable an installer to set the current sensor to a selected current value without first installing and/or energizing the current sensor within a live/hot electrical enclosure.

FIGS. 4-10 illustrate various exploded and detailed views of one embodiment of a current sensor design consistent with the present application. In particular, as illustrated in FIGS. 4-10, current sensor 400 is comparable to the current sensor switch 210b of FIG. 2B. Such embodiment is, however, depicted only for illustrative purposes and to facilitate discussion. The present subject matter is not meant to be limited by or to the particular physical and/or functional embodiment of the device illustrated.

As illustrated in FIGS. 4-10, embodiments consistent with the present subject matter can include a current sensor 400 employing an adjustment control, which, in the illustrated embodiments, comprises a two-part assembly of a knob 402 and shaft 404. It can also include a mechanical stop embodiment 406a with a cooperative component 406b provided to protect the potentiometer and shaft components. A mechanical stop can be integrated into shaft 404 and/or knob 402 to help prevent the pot from being over-tightened, which could lead to potential breaking of the component on the circuit board or breaking the pot shaft. An embodiment can also include a friction mechanism (not shown) to prevent the pot from turning by itself due to vibration, gravity, accidental/inadvertent contact, and/or other causes. Detail in the tooling can additionally and/or alternatively provide friction forces to help hold the knob in place. Also, an embodiment can be constructed comprising an internal collar 408 on shaft 404 to engage a lip or flange 410 on the underside of knob 402 in order to help prevent unwanted and/or unintentional removal of knob 402 after the components have been assembled.

In one embodiment, the knob and the shaft can comprise a two-piece design that can accommodate a label being applied to the product with the knob subsequently being snapped over the top of the label. A label, such as those embodiments depicted in FIGS. 11A-11D, can be sized, shaped, and/or arranged so that, when placed in its intended position and/or configuration, it can display depictions of the numbers and/or other indicia of the scaled range of the pot. Employing this component construction can help a manufacturer avoid having to use a cutout on the label that is big enough to accommodate a pre-assembled or integrated knob. When a scale is provided on such a label, having a relatively reduced-size cutout allows the scaled values to be located in closer physical proximity to the adjustment control, which subsequently can improve accuracy and ease of reading when adjusting the pot. Additional and/or alternative information can also be provided on the label (user installation instructions, configuration information, intended operation characteristics, etc).

Figure 12A:
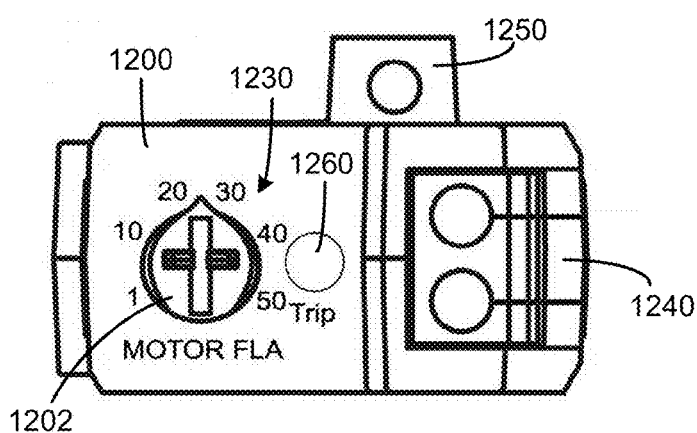
FIGS. 12A and 12B illustrate alternative views of one embodiment of a current sensor apparatus consistent with the present subject matter, representing a first embodiment of a current sensor switch.
Figure 12B:
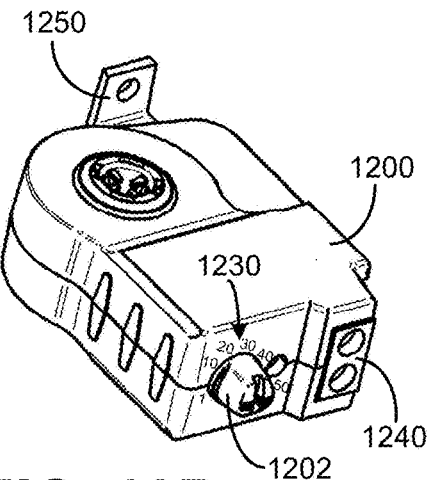

FIGS. 12A and 12B illustrate alternative views of one embodiment of a current sensing apparatus consistent with the present subject matter. In particular, the embodiment of FIGS. 12A and 12B is embodied as a compact solid core current sensor switch 1200. Current sensor switch 1200 can include an adjustment control 1202 in the form of a knob or dial. A calibration scale 1230 can also be provisioned proximate to adjustment control 1202. The current sensor switch 1200 also depicts contacts 1240 and mounting hardware 1250. An LED or other indicator can be provided to indicate trip alarms 1260 (or for other indications, such as status, etc.).

Figure 13B:
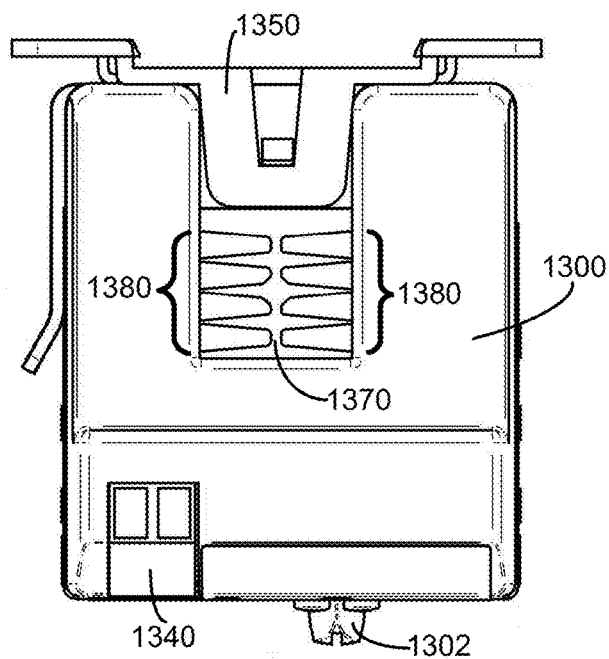
FIGS. 13A and 13B illustrate alternative views of a second embodiment of a current sensor apparatus consistent with the present subject matter, representing a second embodiment of a current sensor switch.
Figure 13A:
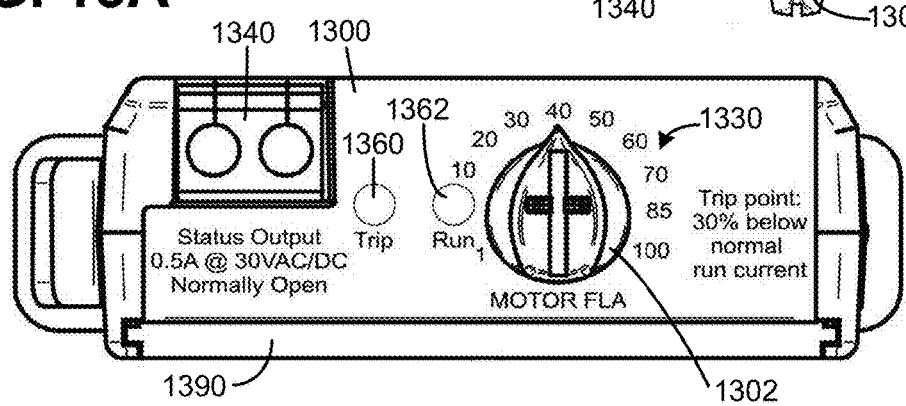

FIGS. 13A and 13B illustrate alternative views of a second embodiment of a current sensing apparatus consistent with the present subject matter. In particular, the embodiment of FIGS. 13A and 13B is embodied as a split-core current sensor switch 1300. Current sensor switch 1300 can include an adjustment control 1302 in the form of a knob or dial. A calibration scale 1330 can also be provisioned proximate to adjustment control 1302. The current sensor switch 1300 also depicts contacts 1340 and mounting hardware 1350, here illustrated as a removable DIN-rail mounting base, although alternative configurations, removable or integrated, could also be implemented. LED or other indicators can be provided to indicate trip alarms 1360, status 1362, or for other indications, etc. As shown in FIG. 13B, current sensor switch 1300 also includes an iris 1370 through which the conducting line is fed. Iris 1370 also can include provisioned projecting finger elements 1380 that can aid in gripping and securing the conducting line within iris 1370.

Embodiments having a knob or other manual adjustment control can offer distinct advantages for installers, mechanics, and other users. For example, an embodiment providing a knob and scale can make it convenient for a user to set the current sensor before it is installed or electromagnetically coupled with a hot current conductor. This enables the installer to calibrate the sensor before running the motor, which presents a significant safety benefit. An installer can install the current sensor in the intended electrical box/panel and the current sensor already can be scaled for the intended application. The installer can install it without having to put his or her hands, or a screwdriver, in an enclosure when the enclosure is energized.

In addition to safety benefits, present embodiments can offer increased convenience, reduced cost of installation, and other advantages, while employing a design that is more economical to manufacture than a traditional current sensor design, and can be significantly cheaper and/or more useful in a broader range of applications than current sensor designs employing expensive microprocessors. Many microprocessors typically cannot be used in applications that do not have over 2 amps. Unfortunately, an overwhelming majority of motors relevant to the present application are 10 amps or less, and a substantial percentage of those are below 2 amps in size. Embodiments as disclosed herein, however, can function at much lower current levels, including levels below 2 amps, such as 1 amp or below, etc. Of course, these values are provided for illustration and to facilitate discussion; they are not intended to limit the claimed subject matter to the particular ranges stated.

Present embodiments can offer a substantially improved design and/or user/installer experience. Such embodiments can allow a user to use a conveniently ascertainable value as the set point for configuring the current sensor. The current sensor can then automatically employ an appropriate trip point consistent with the intended application or desired functionality. As an example of one embodiment, a current sensor can be provided employing a simplified construction, design, and/or electronic characteristics that make it pre-configured and/or pre-designed for a specific intended use, such as proof-of-flow monitoring for a motor and/or other electromechanical device.

As one example, described for illustrative purposes, and not by way of limitation, one embodiment of an apparatus in a proof-of-flow application can comprise a current sensor employing a substantially linearly scaled pot that allows a user/installer to select a conveniently ascertainable value, such as full load amperage ("FLA") of the motor or other monitored device, as a set point value. The resulting output can be an alarm, and/or an analog or digital signal and/or other output appropriate for a proof-of-flow application. It can be beneficial to use FLA, at least in part, because the FLA value can be easily known or ascertained by someone on site.

Consistent with the present subject matter, a current sensor can be installed with a convenient, intuitive procedure. For example, one current sensor embodiment can be made commercially available for a range of appropriate current levels, such as 0-50 amps, as but one example. The installer can simply look at the name plate on the actual motor being monitored and determine what the FLA is for that motor, or the FLA can be determined from other available, convenient sources. The installer can then turn the dial on the pot to the FLA value (which, in a preferred embodiment, can be done by hand using an integrated and/or attached knob or dial). The device can then be installed. As previously discussed, having a substantially linear calibration circuit adjustment can allow embodiments to employ a convenient single-turn pot. And, with a single turn pot, it is also convenient and practical to print a dial scale on the label that corresponds and functions in cooperation with the dial/knob. Alternatively, gradients or markings representing the scale values could also be molded, stamped, or engraved directly into the housing of the current sensor device. The internal trip point threshold setting of the sensor can be established by the current sensing device manufacturer at 60%, or another chosen percentage, of the FLA value selected using the knob/dial.

As previously mentioned, FLA (as well as Horsepower and/or another conveniently accessible motor parameter) can be taken off a motor name plate, off the building and/or system schematics or plans, and/or determined from other convenient sources, such as from an overload protection device that may be installed on the system, or from design specifications. Using the knob, and with reference to an indicated scale and/or scales, (as illustrated in FIGS. 11A-11D and FIG. 20) (printed on attached labeling, molded directly into a current sensor housing, and/or otherwise provisioned for convenient access/viewing), the installer can conveniently and substantially accurately manually set the amperage for the current sensor to the appropriate value and then install the current sensor in its intended location.

Figure 14:
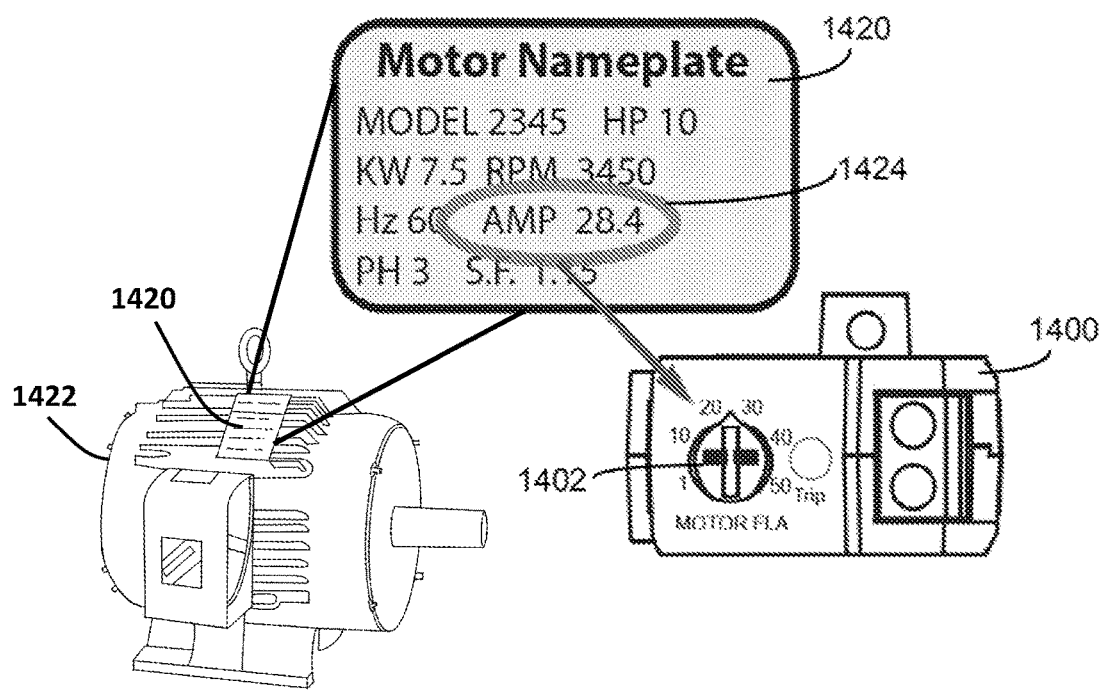
FIG. 14 conceptually illustrates the calibration of a current sensing device, consistent with the present subject matter.

FIG. 14 conceptually illustrates one embodiment of this concept, with obtaining the FLA value from a motor nameplate. With specific reference to FIG. 14, to install a current sensing device 1400 (comparable to the current sensor switch 1200 of FIG. 12), the installer locates the nameplate 1420 on the monitored motor 1422. As illustrated, nameplate 1420 indicates 28.4 Amp as the FLA value 1424. The installer can then dial the adjustor control knob 1402 to the value 28.4 Amps. The current sensing device 1400 is then ready to be installed.

Figure 19:
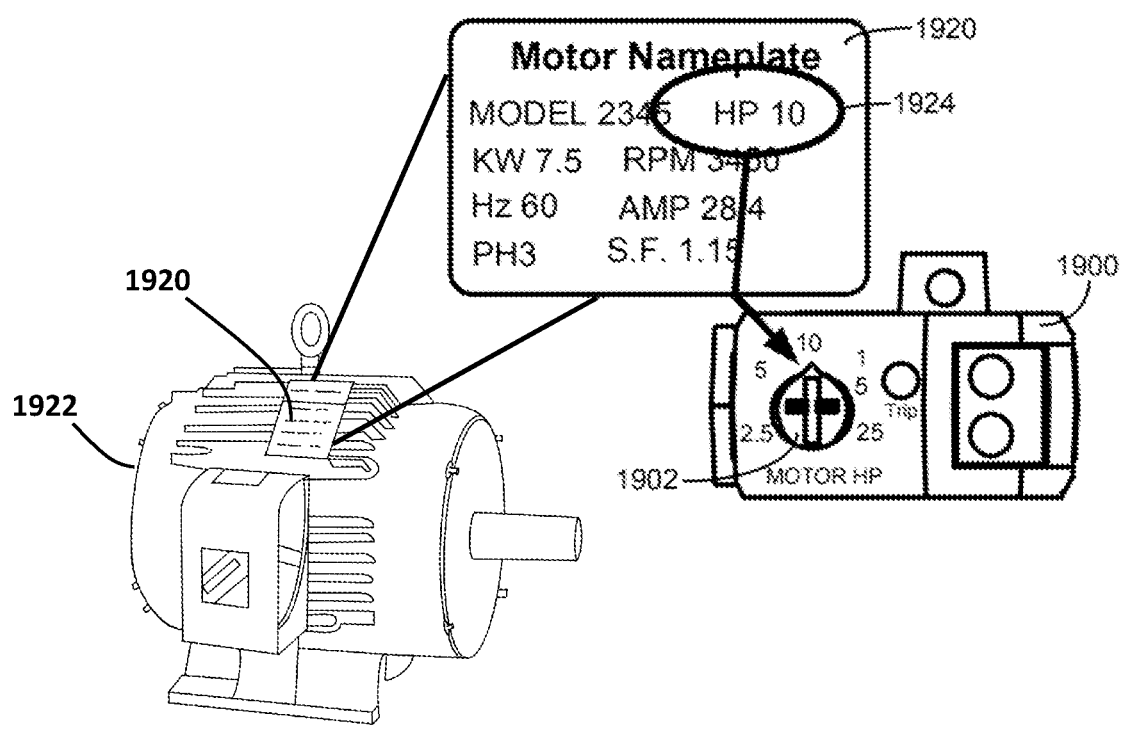
FIG. 19 conceptually illustrates the calibration of a current sensing device, consistent with the present subject matter.
Figure 20A:
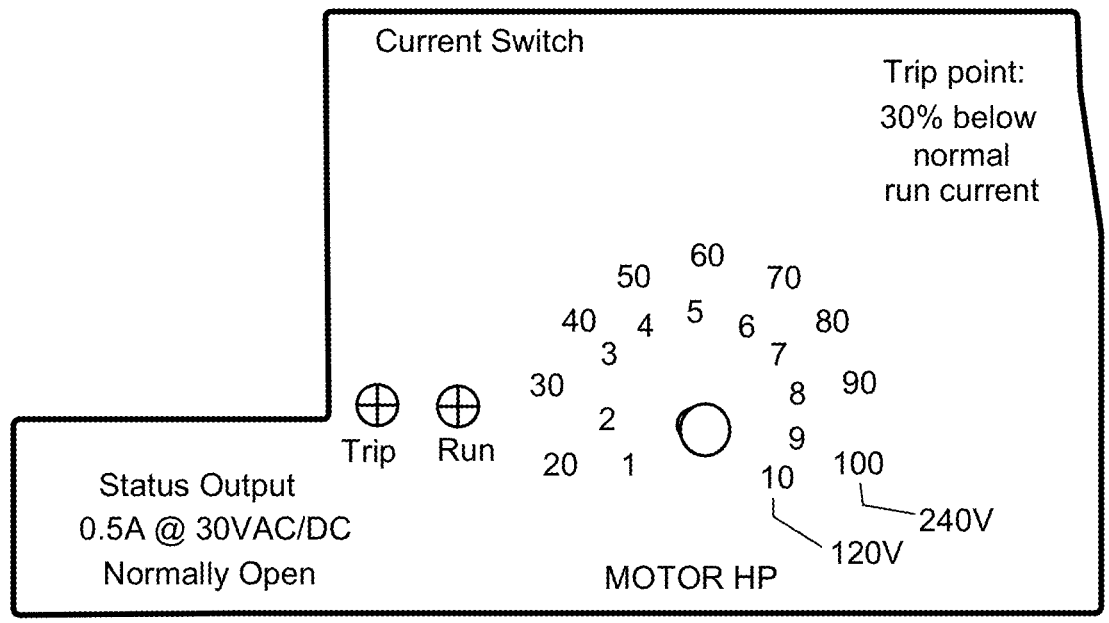
FIGS. 20A-20B illustrate embodiments of an alternative scaled current sensor labels consistent with alternative embodiments of the present subject matter.
Figure 20B:
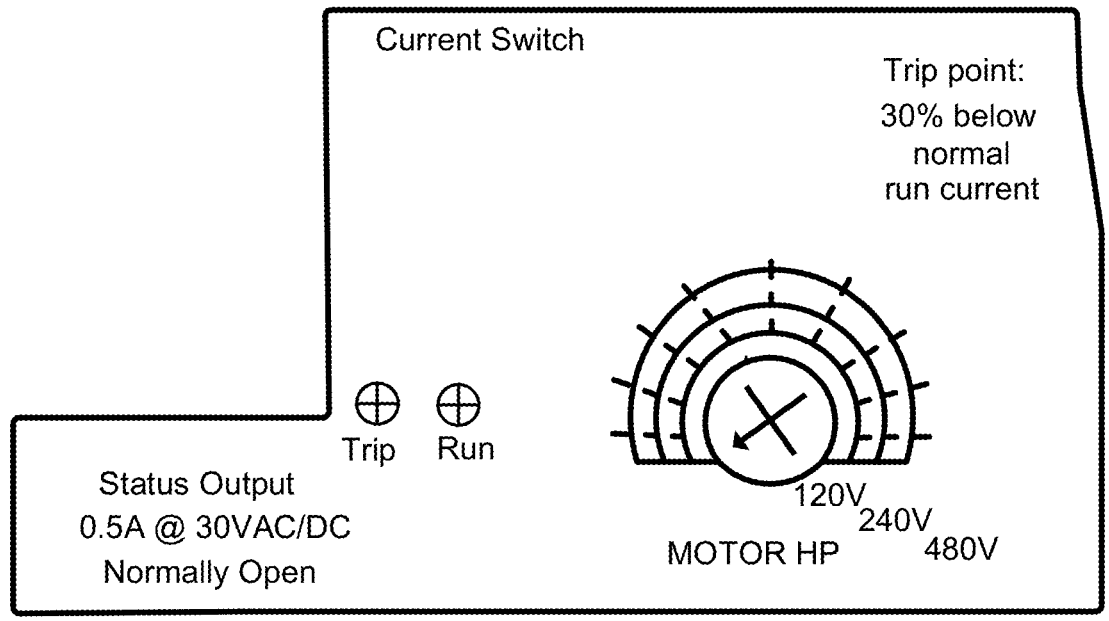

Of course, those skilled in the relevant arts will readily appreciate that the pre-settable aspects of present embodiments can be implemented with one or more other values and/or motor/load parameters, in addition and/or alternative to FLA, that are easily ascertainable (e.g., from a motor nameplate, schematic diagrams, system plans, etc.) without having to first energize the current sensing device. For example, FIG. 19 illustrates an alternative embodiment consistent with the present application. As shown in FIG. 19, alternative information (characterizing the motor, etc.) can be available from the motor nameplate 1420 and employed consistent with the presently disclosed methodologies. For example, as shown in FIG. 19, motor nameplate 1420 discloses values for the motor's model number, horsepower, KW power, RPM, Hz, FLA/Amp, operating power phase, and service factor. In particular, FIG. 19 conceptually illustrates one alternative embodiment of a pre-setting concept, with obtaining and employing the motor horsepower (HP) value from a motor nameplate (as opposed to selecting the FLA value, as depicted in FIG. 14, as but one alternative example of an easily ascertainable parameter/value taken from the motor nameplate 1420). Continuing with specific reference to FIG. 19, to install a current sensing device 1900 (comparable to the current sensor switch 1200 of FIG. 12), the installer locates the nameplate 1920 on the monitored motor 1922. As illustrated, nameplate 1920 indicates 10 HP as the horsepower (HP) value 1924. The installer can then dial the adjustor control knob 1902 to the value 10 HP. The current sensing device 1900 is then ready to be installed.

Additionally, at least in part for reasons of efficiency, reduced inventory, and greater installer flexibility, an embodiment as illustrated in FIG. 19 can also employ multiple dimensional value scales (arranged in substantially concentric circles or partial circles). As those skilled in the art will appreciate, because horsepower is voltage dependent, such current sensing device embodiments can accommodate and/or exhibit multiple scales/ranges for an installer to reference when pre-setting the device, depending, at least in part, on the applicable voltage. A label, such as the embodiments depicted in FIGS. 20A-20B, can be sized, shaped, and/or arranged so that, when placed in its intended position and/or configuration on the current sensing embodiment, it can display depictions of the numbers and/or other indicia of the scaled ranges of the potentiometer. Of course, the actual values illustrated are presented only for illustrative purposes, and not by way of limitation. Additionally and/or alternatively, a PCB jumper and/or other selection mechanism or user input interface can additionally or alternatively be provided to allow the user to select the appropriate HP scale for the applicable voltage.

Figure 15:
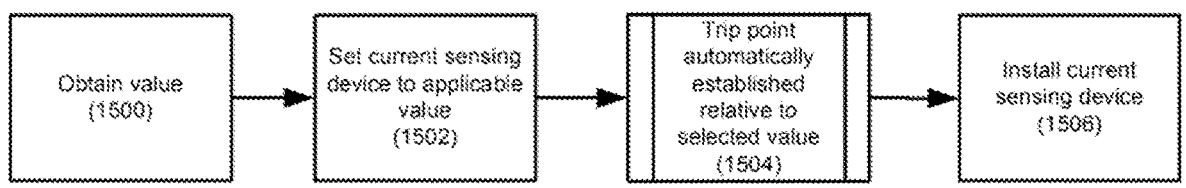
FIG. 15 illustrates a process flow diagram for calibrating and installing a current sensing device, consistent with the present subject matter.

FIG. 15 depicts one embodiment of a process flow consistent with the above-disclosed procedures. As illustrated in the embodiment depicted in FIG. 15, initially step 1500 involves obtaining the FLA value 1500 from an appropriate source (e.g., motor nameplate, system plans, overload protection device, etc.). Next, at step 1502, the installer uses a manual adjustment control to set the current sensing device to the applicable FLA value. At step 1504, the current sensing device automatically establishes the appropriate trip point relative to the provided FLA value. It should be noted that the internal scaling of step 1504 can occur substantially simultaneous with setting the adjustment control in step 1502. Finally, at step 1506, the current sensing device can be installed in its intended location.

The current sensor can be internally preconfigured to facilitate the intended functionality automatically, such as being preconfigured for proof-of-flow monitoring. As such, given that the selected value is an FLA set point, the current sensor can be preconfigured to trip, alarm, and/or send an control signal if there is an appropriate, predetermined amount of current loss (e.g., a trip point value is established below the FLA set point amperage, for a proof of flow application).

For a proof-of-flow application, a current sensor embodiment can be pre-configured to employ a trip point that is sufficiently and appropriately below the amperage value corresponding to the knob setting (e.g., FLA, HP, etc.). Applicants have determined that in proof of flow monitoring, a sensed motor current loss of approximately between 20-35% can be commonly experienced in response to a loss of load (e.g. belt break/loss, coupling shear, and/or other mechanical failure). In certain applications, a loss of up to 40% or more can be experienced (e.g., if you have a belt brake on a fan, as but one example). Of course, those skilled in the art will appreciate that alternative applications can potentially result in other expected loss levels. A present current sensor embodiment, being used for proof of flow, can be internally scaled so that for a given set point, it will employ a corresponding trip point that is proportionally and appropriately less than the provided set point. The quantity of offset can be predetermined and preconfigured into the current sensor at a given quantity below the FLA set point, such as 30% or 40%, as but two examples. Such an embodiment can offer a simple, convenient, and easy to use current sensor apparatus that can be pre-scaled, in an application specific way/amount, for proof of flow. Generally speaking, for most typical installations/environments, it is desirable to employ a trip point that is set far enough below FLA to avoid experiencing nuisance alarms and/or undue quantities of false trips, but close enough to FLA to detect, rapidly and accurately, anticipated possible loss of flow occurrences. It should be appreciated, however, that additional and/or alternative embodiments could employ different scaling methodologies, pre-set and/or field-configurable, for other applications, other types of monitoring, or other desired functionality. Similarly, alternative internal scaling could be preconfigured into current sensors used for alternative purposes/applications.

Those skilled in the art will readily appreciate the benefits of using present embodiments of current sensors for proof-of-flow applications, at least as opposed to previously available devices. To use a traditional adjustable current sensor for proof of flow applications, someone in the field would be required to conduct a calculation or other adjustment to discount FLA or running current by an estimated appropriate amount to conduct proof-of-loss determinations, although such field determinations and/or adjustments are imprecise and error prone. By default, a traditional current sensor set at 10 amps would be expected to trip (or signal/alarm) substantially at the set point of 10 amps. To configure the current sensor to trip at a lower set point, an installer would have to turn a multi-turn pot to the motor's running current, and then turn the pot back some amount for calibration at an estimated lower value. However, such a procedure provides uncertain and imprecise results. With present embodiments, a setting of 10 amps would result in a trip point at 7 amps, if, for example, a 30% offset was employed by the current sensor. An alternative embodiment could be configured to trip at 6 amps, if a 40& offset was employed, or at some other trip point value offset from the set point by an alternative quantity and/or percentage specifically selected for the specific proof of flow application and/or the specific current sensing device.

For increased accuracy/reliability, improved performance, and/or other advantageous reasons, additional and/or alternative embodiments consistent with the present subject matter can adopt and/or implement one or more applicable operating assumptions. For example, it can be determined and/or assumed that, for a given application, type of equipment, etc., a properly loaded motor will run at approximately 80-90% of its nameplate FLA. This expected decreased current level substantially represents the normal operating current for the motor/system. In other words, the FLA value can be 10% or more overstated from the level of current a properly loaded motor would be expected to actually draw while running normally for the applicable installation. When a belt breaks, or other load loss is experienced, the current load is expected to further decrease, in some applications up to 40% or more from FLA. For example, a motor with a FLA nameplate value of 100 amps can be assumed to run at 80-90 amps when it is properly loaded. When the belt breaks, the current can be expected to drop again, possibly to 60 amps, in the present example. The internal settings of present embodiments can be designed to accommodate both types and/or instances of expected current drop without requiring an actual measurement of the running current for initial calibration. Such embodiments can offer improved accuracy and reliability while affording an installer the advantage of conveniently being able to calibrate a current sensing device before it is installed in an energized enclosure.

As a further example, if a motor has an FLA of 10 amps, the current sensor can operate under the assumption that the running current is actually 9 amps. The current sensor can then offset the 9 amp value by a pre-determined percentage (such as a percentage selected roughly between 20 and 35%, as one example) to establish a trip point for the sensed current. Of course, additional and/or alternative embodiments could be provided that establish a trip point only with reference to the provided FLA set point, and without discounting the provided FLA value to represent expected normal running current.

Figure 16:
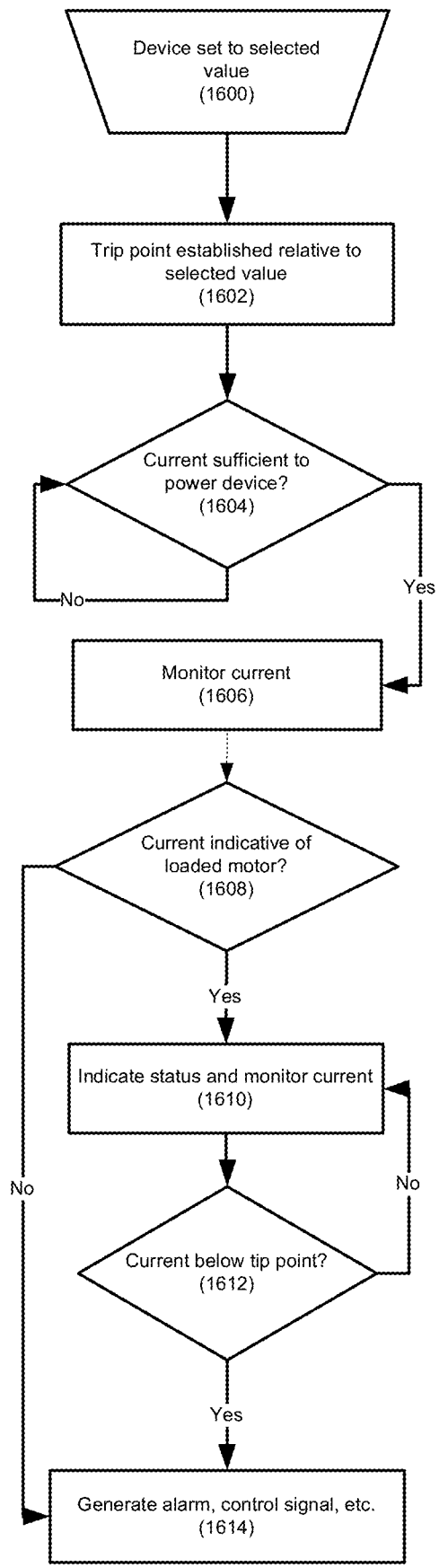
FIG. 16 illustrates a process flow diagram for a current sensing methodology, consistent with the present subject matter.

FIG. 16 represents one embodiment of a process flow diagram for a current-sensing methodology as discussed herein. With specific reference to FIG. 16, at step 1600, a current sensing device is set to the appropriate FLA value. At step 1602, the appropriate trip point is automatically established relative to the FLA setting. Decision step 1604 determines if there is sufficient power for the current sensing device (either independent power or power induced from the monitored line). If not, the device is not expected to operate for its intended purpose. Once there is sufficient power, the device commences monitoring the current during step 1606. Decision step 1608 determines if the sensed current is sufficient to indicate a loaded motor. If not, a belt might have been broken (or other load loss failure occurred) before the system startup. In that case, the process can jump to step 1614 and generates the appropriate trip alarm or control signal. If the current level indicates a loaded motor (preferably with accommodation for any inrush spikes in current for motor startup), the current sensing device can indicate the loaded status continue to monitor the current levels at step 1610. If at decision step 1612 the current sensing device detects that the current has dropped below the trip point, the process advances to step 1614 and the appropriate alarm and/or signal is initiated. Otherwise, the process continues monitoring with step 1610.

Of course, those skilled in the relevant art will appreciate that the above ranges are presented for illustrative purposes and to facilitate discussion. Expanded, reduced, and/or alternative ranges could also be applicable for a specific application. The offset values used by current sensor embodiments can, however, be selected by the manufacturer so as to provide set and/or trip points appropriate for the expected parameters/characteristics of the application within which the particular current sensor embodiment is intended to operate.

For example, when manufacturing a specific current sensing device, such as the current sensor switches of FIGS. 12 and 13, a manufacturer can identify, adopt, and/or select certain assumptions that will, at least in part, govern operation of the device. For example, in reviewing applicable studies and documentation, holding empirical trials, and/or surveying/interviewing engineers in the a particular field of application (such as HVAC engineers, as but one example), a manufacturer can adopt a governing assumption that installed and properly loaded motors typically operate within the range of 75% to 85% of their FLA. Similarly, a further assumption could be adopted that motor run current is reduced by an average of 30% or more when load loss occurs due to coupling shear, belt loss, etc. Manufactured devices can be internally configured to provide proof of flow monitoring and/or control based on these underlying assumptions. For example, consistent with the present subject matter, a current sensor can be provided with a dial scale intended to be calibrated to FLA. The thresholds of the current sensor can then be internally established to indicate status at currents above 70% of the FLA value indicated on the scale, and release at currents below 60% of the indicated FLA.

Figure 17:
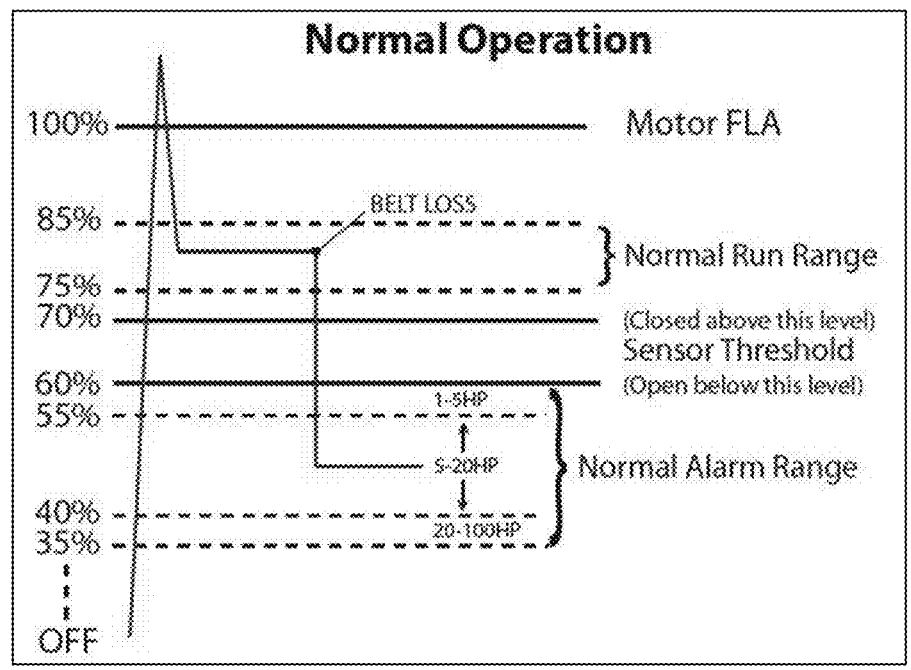
FIG. 17 graphically illustrates the effect of operating assumptions on a normally operated motor, consistent with the present subject matter.

For example, in an embodiment employing the illustrative operating principals indicated above, a motor with a nameplate current of 60 FLA can be expected to operate at approximately 48 Amps (80% of 60 FLA.) In the event of load loss, the motor run current can be expected to decrease by 30% to 33.6 Amps. A current sensor set to 60 Amps FLA will correctly detect that the example motor is running at or above 42 Amps (70% of 60 FLA,) and will also correctly detect the load loss condition below 36 Amps (60% of 60 FLA). These illustrative operating principals are graphically illustrated in FIG. 17, which depicts monitored current over time. With respect to FIG. 17, the y-axis represents current as a relative percentage of FLA. The x-axis depicts advancing time.

Giving weight to application-specific performance or requirements can make it possible to offer multiple versions of a current sensor device, each one of which can be preconfigured for specific implementations, levels of fault tolerance, performance levels, or other desired considerations. As but one example, current sensor embodiments can be offered in high-sensitivity and low-sensitivity versions (e.g., a high-sensitivity sensor might be configured to trip at 20% below FLA, while a low-sensitivity version can be configured to trip at 30% below a 10% discounted FLA). These alternative embodiments can be offered as separate and discrete devices, or a single device can be constructed with a switch or other control that can allow a user to select the desired sensitivity level and/or configuration. Of course, other variations can also be provided for employing additional and/or alternative embodiments equally consistent with the claimed subject matter.

Figure 18:
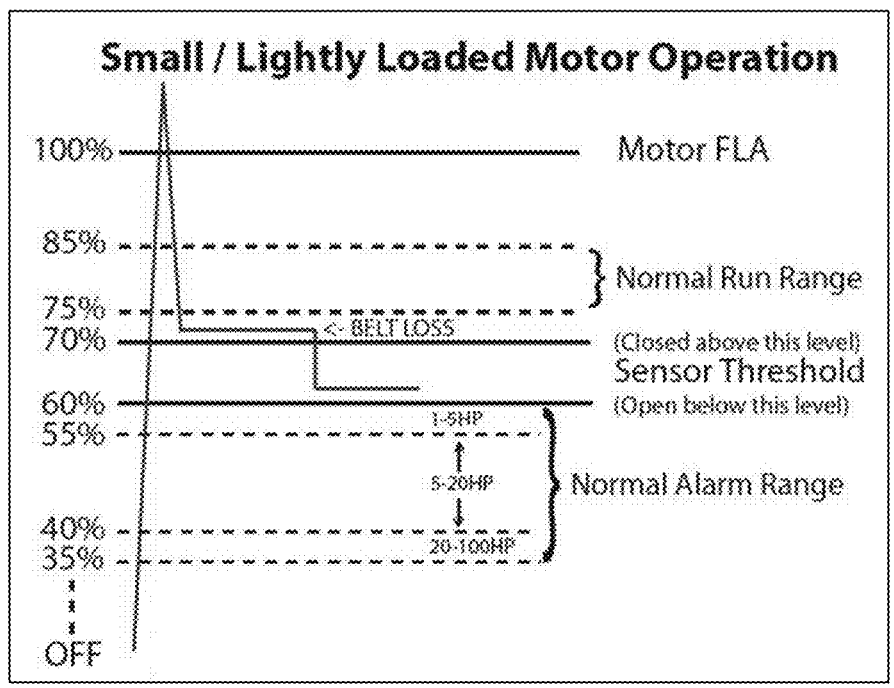
FIG. 18 graphically illustrates the effect of operating assumptions on a small or lightly loaded motor, consistent with the present subject matter.

As one example of a variation that can be provided as one aspect of an additional and/or alternative embodiment, LEDs and/or other visual indicators can be provided with current sensor embodiments to allow an installer the option of performing a calibration procedure substantially consistent with the methodology used with traditional current sensors, either for providing the installer with the option to use a more familiar procedure, or for applications that substantially do not conform to the assumptions or pre-set loss-of-flow settings employed by a given current sensor embodiment. One such example would be for applications having very small or very lightly loaded motors. FIG. 18 depicts one example of a graphical representation of monitored current over time in a system operated with a small or lightly loaded motor. If the system of FIG. 18 employed the operating assumptions as the system of FIG. 17, it becomes apparent that, upon belt loss in FIG. 18, the current may not drop below the trip threshold of 60% of FLA. However, the current sensor would detect the load loss when the motor is restarted, as long as the motor current was below 70% of FLA. However, system variances such as this illustrate the advantages of having a current sensing device that can additionally and/or alternatively accept a conventional calibration procedure, for situations in which the standard operating assumptions may not provide the optimal results.

Additional and/or alternative embodiments can also encompass current sensor devices comprising a housing that can substantially accommodate the addition and/or removal of components such as control relays from a convenient location and/or configuration, such as the face of the current sensor unit, as but one example. Such embodiments can offer one or more of the advantages described above in an additionally convenient all-in-one package that can provide switching for device protection, automation control, and/or other purposes. The housing of present current sensing device embodiments can also be constructed so as to have an integrated or removable mounting base that facilitates DIN rail mounting of the device.

It will be obvious to those having skill in the art that many changes may be made to the details of the above-described embodiments without departing from the underlying principles of the invention. The scope of the present invention should, therefore, be determined only by the following claims.

The invention claimed is:

1. A current sensor system enabling calibration prior to energization and configured for detecting loss of flow or other load loss, comprising:
   a calibration scale visually indicating a range of values corresponding to one or more potential loads;
   a current sensing circuit including:
      a current transformer for measuring current to a monitored load chosen from among the one or more potential loads; and
      calibration circuitry configured to accept, prior to energization, an indicated value representing the monitored load, the indicated value selected from among the range of values, whereupon the calibration circuitry employs, for the monitored load, a loss-of-flow set point corresponding to the indicated value; and
   an adjustable potentiometer for providing the indicated value to the calibration circuitry, wherein the adjustable potentiometer is provisioned proximate to the calibration scale indicating the range of values so as to facilitate adjustment of the calibration circuitry for the monitored load;
   whereby, upon providing the indicated value, the current sensing circuit is configured for detecting loss of flow for the monitored load responsive to the current transformer measuring at least a predetermined amount of current decrease relative to the loss-of-flow set point.

2. The system of claim 1, wherein the indicated value is selected based at least in part on a characteristic of the monitored load, wherein the indicated value is obtainable before energizing the current transformer.

3. The system of claim 1, wherein the indicated value is chosen from a group consisting essentially of: FLA, HP, Motor Class, RPM, KW, Frequency, Phase, and Service Factor.

4. The system of claim 1, further comprising a manual adjustment control coupled to the potentiometer, wherein the manual adjustment control is constructed to facilitate adjustment by hand without requiring the use of a tool.

5. The system of claim 1, wherein the range of current values are approximately evenly distributed along the calibration scale.

6. The system of claim 1, wherein the calibration circuitry exhibits a substantially linear relationship between a position of the adjustable potentiometer and a corresponding value from within the range of values.

7. The system of claim 1, wherein the adjustable potentiometer is a one-turn potentiometer.

8. The system of claim 1, wherein:
   the current sensing circuit is disposed within a housing; and
   the housing is configured to cooperatively accommodate a control relay.

9. A loss-of-flow current sensor apparatus enabling calibration prior to energization, comprising:
   a current sensing circuit having calibration circuitry substantially linearly scaling a range of values for selection by a user;
   a manual adjustment control configured for selecting a value from among the linearly scaled range of values without energizing the current sensing circuit; and
   a calibration scale provisioned proximate to the manual adjustment control for facilitating a selection of the value before the current sensing circuit is energized;
   whereby, upon the user selecting the value from among the linearly scaled range of values, the current sensing circuit is configured to detect loss of flow by measuring a predetermined drop in running current relative to the selected value.

10. The apparatus of claim 9, wherein the current sensing circuit includes a one-turn potentiometer.

11. The apparatus of claim 10, wherein the one-turn potentiometer is coupled to the manual adjustment control, whereby positioning the manual adjustment control correspondingly adjusts the one-turn potentiometer.

12. The apparatus of claim 9, wherein the manual adjustment control is a knob configured for adjustment by hand without requiring the use of a tool, and the linear scaled range of values is chosen from a group consisting essentially of: FLA, HP, Motor Class, RPM, KW, Frequency, Phase, and Service Factor values.

13. A method comprising:
   indicating a value for use in monitoring proof of flow to a monitored load, the indicated value characterizing the monitored load;
   manually calibrating a current sensor by providing the indicated value prior to energizing the current sensor; and
   employing the current sensor with the indicated value to sense current to the monitored load and indicate loss of flow in response to measuring a running current representing a trip point value at least a predetermined amount different than the indicated value.

14. The method of claim 13, wherein manually calibrating the current sensor to the desired current value occurs before the current sensor is installed.

15. The method of claim 13, wherein the value is chosen from among a group consisting essentially of: FLA, HP, Motor Class, RPM, KW, Frequency, Phase, and Service Factor.

16. The method of claim 15, further comprising determining the full load amperage from one of a motor name plate or a system plan.

\* \* \* \* \*